United States Patent [19]

Galik

[11] Patent Number: 4,678,545

[45] Date of Patent: Jul. 7, 1987

[54] PRINTED CIRCUIT BOARD FINE LINE PLATING

[76] Inventor: George M. Galik, 3236 Falcon Ridge Rd., Diamond Bar, Calif. 91765

[21] Appl. No.: 873,519

[22] Filed: Jun. 12, 1986

[51] Int. Cl.$^4$ .............................................. C25D 5/02
[52] U.S. Cl. ................................. 204/15; 204/DIG. 7
[58] Field of Search .................... 204/23, 231, DIG. 7, 204/15

[56] References Cited

U.S. PATENT DOCUMENTS

| | | | |
|---|---|---|---|
| 1,526,644 | 2/1925 | Pinney | 204/15 |
| 3,023,154 | 2/1962 | Hough et al. | 204/242 |
| 3,437,578 | 4/1969 | Gibbs et al. | 204/231 |
| 3,809,642 | 5/1974 | Bond et al. | 204/275 |
| 3,880,725 | 4/1975 | Van Raalte et al. | 204/15 |
| 3,954,569 | 5/1976 | Vanderveer et al. | 204/15 |
| 4,469,564 | 9/1984 | Okinaka et al. | 204/15 |
| 4,507,180 | 3/1985 | van der Werf et al. | 204/5 |

FOREIGN PATENT DOCUMENTS 496113 11/1938 United Kingdom ................ 204/231

OTHER PUBLICATIONS

*Circuit World*, vol. 11, No. 4, 1985.
"Current-Distribution Improving Aids", *Metal Finishing*, Mar. 1961, vol. 59, No. 3.
"Electroplating with Improved Layer Thickness Distribution", *IBM Technical Disclosure Bulletin*, vol. 27, No. 5, Oct. 1984.

Primary Examiner—T. M. Tufariello
Attorney, Agent, or Firm—Christie, Parker & Hale

[57] ABSTRACT

Printed circuit boards and methods for uniformly electroplating narrow, closely spaced circuitry lines onto such a circuit board substrates are disclosed. The method comprises providing an electroplating tank containing an electroplating solution with at least one anode immersed therein. A conductive metal screen is immersed in and extends across the electroplating solution at a solution spaced apart from such an anodes. A printed circuit board substrate is then placed into the electroplating solution at a position wherein the screen is between the anode and the substrate. Copper is then simultaneously plated onto the printed circuit board substrate at a first voltage and onto the screen at a second voltage when the second voltage is less than the first voltage.

26 Claims, 8 Drawing Figures

PRINTED CIRCUIT BOARD FINE LINE PLATING

FIELD OF THE INVENTION

This invention relates to printed circuit boards and to an electroplating process useful for producing such circuit boards.

BACKGROUND OF THE INVENTION

Printed circuit boards are laminated structures typically comprising a generally rigid, non-conductive base or core with conductive circuitry, generally in the form of a plurality of copper lines, applied on one or both sides of the core. The copper lines interconnect holes which extend through the core for receiving pins of various electrical components. The holes are typically lined with a conductive coating to provide a site for electrical contact with the various electronic components which are plugged into the printed circuit board and to provide a conductive bridge between the two sides of the printed circuit board. The circuitry is covered and protected by a non-conductive coating which does not extend into the holes.

The conductive circuitry can be applied to the core by first bonding a sheet of copper foil to each side of the core and then applying a photosensitive material over the copper foil. Illumination of the photosensitive material with ultraviolet light in a desired pattern cures the illuminated material. The material that was not illuminated is then removed to expose the underlying copper foil. The exposed copper foil is then electroplated with copper to a desired thickness to generate the circuitry lines which are then plated with a solder mixture of tin and lead. The remaining photosensitive material is then removed and the unwanted copper foil is etched away, e.g., with an etch solution which dissolves copper but not the solder plate. The remaining copper circuitry lines are then covered with a protective coating.

During a standard electroplating process, the periphery of the printed circuit board, i.e., the portions of the printed circuit board near its outer edges, tends to be at a higher current density than the center of the printed circuit board. Hence, copper metal deposits more rapidly near the periphery of the printed circuit board than at the center. The result of this is that by the time the copper has deposited at the center of the circuit board to form a line of a desired thickness, the copper forming a line near the periphery has typically deposited to a thickness greater than the thickness of the photosensitive layer. When this happens, the width of the depositing copper lines increases as the copper deposit begins to grow laterally over the top of the photosensitive layer. The resulting copper circuitry lines near the periphery develop a cross-sectional configuration resembling a mushroom.

It is desirable in printed circuit boards to have the copper lines as close to each other as possible while assuring that no electrical contact between the lines occurs unless specifically desired. The reason for having lines closer together is to be able to locate more electronic components on a circuit board for a given amount of circuit board area. However, the increase in the width of the copper lines in the high current density areas during the electroplating process provides a limiting factor as to how close the copper lines can be.

At the present time a ten mil copper line width with a ten mil spacing between the lines is considered standard. By conventional techniques, a five mil line width with a five mil spacing is possible. There is, however, an ongoing need for a process more efficient than prior art processes for producing lines with a five mil width and also for a process that can efficiently produce lines having less than a five mil width and spacing.

SUMMARY OF THE INVENTION

A printed circuit board is provided that comprises a plurality of lines of an electroconductive metal such as copper. Portions of such lines are parallel to portions of adjacent lines wherein at least some of the adjacent parallel line portions are spaced apart from each other no more than a selected distance for example, no more than about 5 mils.

The circuit board of this invention is made possible by a method for uniformly electroplating a generally flat substrate in an electroplating system where the difference between the current density at the periphery of the substrate and the current density at the center of the substrate is reduced compared to such current density differences in prior electroplating processes.

The method comprises providing a printed circuit board substrate comprising a nonconductive base, an electrically conductive layer over at least one side of the base, and a nonconductive layer over portions of the electrically conductive layer. The nonconductive layer forms the pattern for the circuit to be formed on the board by covering such portions of the conductive layer where metal lines are not desired and by leaving uncovered those portions of the conductive layer where metal lines are desired. The pattern includes a plurality of lines to be formed wherein portions of a plurality of such lines are parallel to portions of adjacent lines where the width of the nonconductive layer between at least some of the adjacent parallel portions is not more than about a selected small value, e.g., no more than about 5 mils. An electroplating tank comprising an electroplating solution for the metal to be plated is also provided. At least one anode is immersed in the metal electroplating solution and a conductive grating is immersed in the solution and extends across the electroplating tank at a position spaced apart from the anode. The grating is made of a metal screen, wire cloth or the like and has a mesh size preferably of from about 60 to about 325, and more preferably a mesh size of about 200. The grating is preferably made of stainless steel.

The printed circuit board substrate is immersed in the electroplating solution at a location spaced apart from the anode so that the screen extends across the path between the anode and the substrate.

A first potential difference is established between the anode and the subtrate, e.g., by connection of the anode and substrate to a rectifier or the like, so that metal deposits on the substrate. A second potential difference is established between the anode and the screen so that metal also plates out on the screen. Thus, the screen voltage must always be less positive than the anode voltage. The second potential difference is preferably less than the first potential difference but is sufficient to reduce the difference in current density between the periphery and center of the substrate to thereby result in generally uniform plating of the substrate. A second potential difference which is about ($\frac{1}{8}$) to about ($\frac{1}{2}$) of the first potential difference and more preferably about $\frac{1}{4}$ of the first potential difference is presently preferred.

BRIEF DESCRIPTION OF THE DRAWINGS

These and other features and advantages of the present invention will be more fully understood when considered with respect to the following detailed description, appended claims and accompanying drawings wherein:

DETAILED DESCRIPTION

Figure 1:
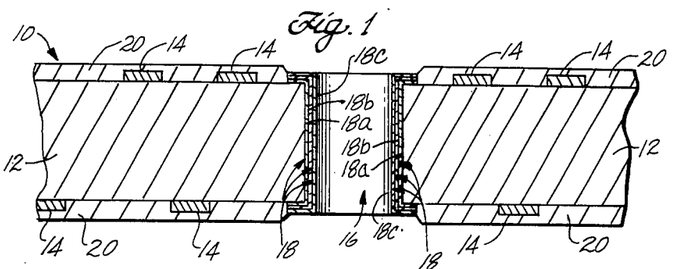
FIG. 1 is a semi-schematic, fragmentary, cross-sectional view of one embodiment of a printed circuit board provided in accordance with practice of principles of this invention.

With reference to FIG. 1, there is shown a semi-schematic, fragmentary, cross-sectional view of one embodiment of a printed circuit board 10 provided in accordance with practice of principles of this invention. The circuit board 10 is a laminated structure comprising a nonconductive core 12 made of seven layers of glass cloth which are impregnated with epoxy resin. A plurality of conductive copper circuitry lines 14 extend over the core 12 in a selected circuit pattern interconnecting holes 16 located at various positions on the board. The holes 16 are lined with a conductive layer 18 which forms a conductive bridge between the two sides of the board. The copper lines 14 are separated and covered by a nonconductive, protective material 20.

Figure 2:
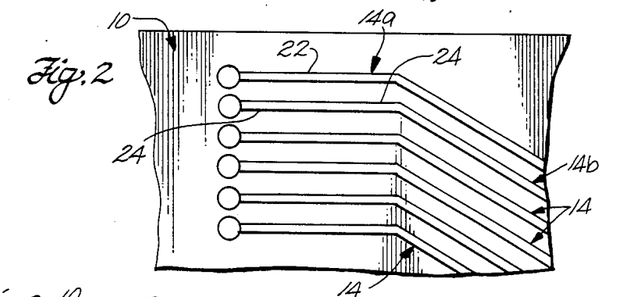
FIG. 2 is a semi-schematic, fragmentary, plan view of the circuit board of FIG. 1 showing a plurality of conductive copper lines on its surface.

Referring to FIG. 2, there is shown a fragmentary plan view of the circuit board of FIG. 1. As is the case with prior art circuit boards, the board 10 of this invention comprises a circuit pattern made up of a plurality of electroconductive copper lines 14 wherein portions of the plurality of such lines are parallel to portions of adjacent lines. For example, the portion 22 of the line 14a is parallel to the portion 24 of the line 14b. In presently available standard circuit boards, the minimum width of electroconductive lines is about 5 mils and parallel portions of such lines are no closer than about 5 mils from each other. However, as is described below in greater detail, by utilizing techniques provided in accordance with practice of this invention, the width of the electroconductive lines provided on a circuit board can be less than 5 mils and parallel portions of such lines can be spaced apart from each other less than 5 mils. In one exemplary embodiment, the line width of the electroconductive lines on a circuit board provided in accordance with practice of principles of this invention is 2 mils and the parallel portions of such lines are spaced 2 mils apart. Having a narrow line width with narrow spacing is a significant advantage for enhancing the economics of circuit board production and use.

Figure 3:
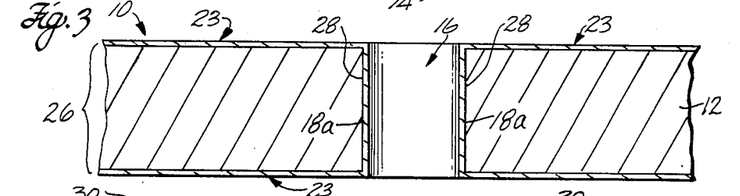
FIG. 3 is a semi-schematic, fragmentary, cross-sectional view of the printed circuit board of FIG. 1 at one stage of its manufacture.

With reference to FIG. 3 there is shown a semi-schematic, fragmentary, cross-sectional view of the printed circuit board 10 of FIG. 1 at one stage in its manufacture. The circuit board 10 is formed by first bonding a conductive layer 23 of copper foil having a thickness of about 1 mil to each side of the nonconductive core 12 to form a sandwich structure 26. Holes 16 are made by first placing a backup material, e.g., an aluminum sheet (not shown), on one side of the sandwich structure and an entry material, e.g., another aluminum sheet (not shown), on the other side of the sandwich structure, and then drilling holes through the entry material, sandwich structure and backup material on a computer-operated drill press.

After the holes 16 have been drilled, the entry and backup materials are removed, and the walls 28 of the core 12 which define the holes 16 are coated with a conductive copper coating 18a to form a conductive bridge between the two copper foil layers 23. This is accomplished by means of a conventional electroless plating process. Such processes are also referred to as "through-hole" plating processes.

Typically, electroless plating processes for printed circuit boards involve first immersing the drilled sandwich structure 26 in a palladium catalyst solution, e.g., comprising a colloidal tin-palladium catalyst, for a selected period of time. The sandwich structure 26 is then removed and water rinsed and, if required by the particular process, immersed in an activator solution which strips the tin from the catalyst, thereby exposing the palladium. The sandwich structure 26 is then water rinsed and immersed in a copper electroless plating solution wherein copper metal deposits over the surface of the sandwich structure, including the surface which defines the holes 16. Copper continues to deposit autocatalytically until the desired thickness is obtained. A thickness of about 25 micrometers is typical.

Figure 4:
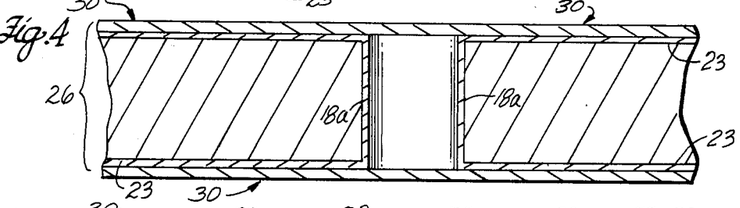
FIG. 4 is a semi-schematic, fragmentary, cross-sectional view of the printed circuit board of FIG. 1 at another stage of its manufacture.

Turning to FIG. 4, there is shown a semi-schematic, fragmentary, cross-sectional view of the circuit board of FIG. 1 at yet another stage of its manufacture. A nonconductive, photosensitive layer 30 is applied by conventional means, e.g., spraying, diping, laminating etc., to each side of the electrolessly plated sandwich structure 26. The thickness of the photosensitive layer 30 depends on the requirements of the particular application for which the printed circuit board will be used. A thickness of about 1 mil is typical. Once applied, the photosensitive layer is illuminated with ultraviolet light in the image of the desired circuit pattern. In the first method the image may correspond to the actual desired circuit, or, in a second method the image may correspond to the negative of that circuit design. That is, in the second method the photosensitive layer is exposed to ultraviolet light except for those portions or areas which correspond to the actual desired circuitry lines. The ultraviolet light cures the portions of the photosensitive layer which are exposed. The uncured portions, which, in the second method, correspond to the desired circuitry lines, are then removed by immersion in a developer solution or solvent. This dissolves the uncured photosensitive material but not the cured photosensitive material. This results in the exposure of the underlaying copper foil layer 23 in the pattern of the desired circuitry lines.

Figure 5:
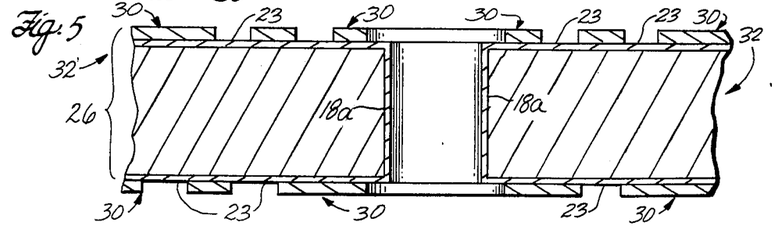
FIG. 5 is a semi-schematic, fragmentary, cross-sectional view of the circuit board of FIG. 1 at yet another stage of its manufacture.

Turning to FIG. 5, there is shown a semi-schematic, fragmentary, cross-sectional view of the circuit board of FIG. 1 at yet another stage in its manufacture. The printed circuit board substrate 32 formed with the copper layer 23 exposed in the desired pattern of circuitry lines is electroplated to form the copper circuitry lines. This is accomplished by first providing a copper electroplating solution. Most conventional copper electroplating solutions may be used. For example, one suitable copper electroplating solution comprises 14 to 17 ounces per gallon of copper sulfate with a total copper content of 3.6 to 4.3 ounces per gallon, and 27 to 30 ounces per gallon of sulfuric acid. The chloride content of the solution is 15 to 75 ppm. Various proprietary additives, e.g., brightners, levelers, etc., may be incorporated into the copper electroplating solution as desired.

Figure 6:
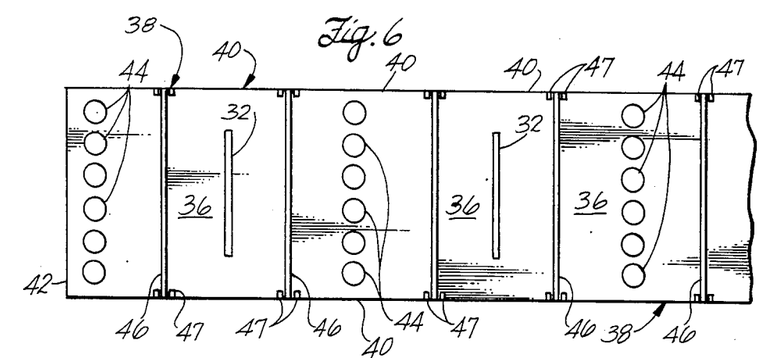
FIG. 6 is a top view of an exemplary embodiment of an electroplating arrangement provided in accordance with practice of principles of this invention.
Figure 7:
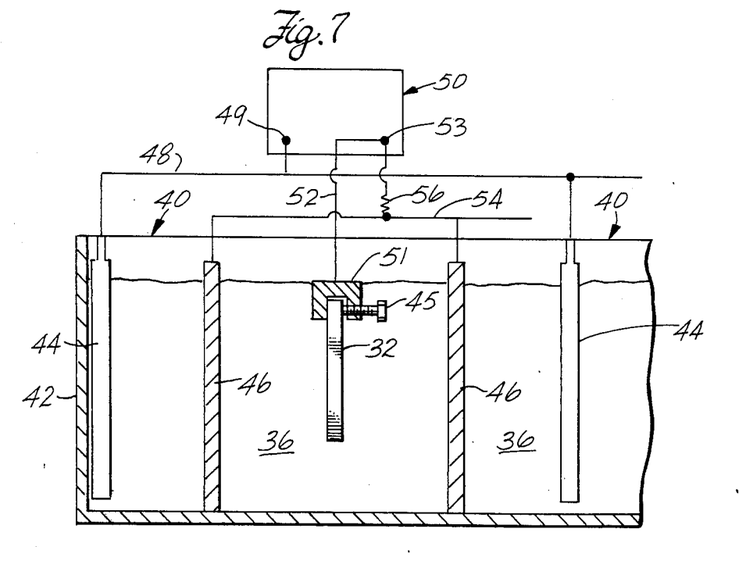
FIG. 7 is a semi-schematic, fragmentary, cross-sectional view of the electroplating arrangement of FIG. 6.

With reference to FIGS. 6 and 7, there are shown semi-schematic, fragmentary, top plan and side cross-sectional views, respectively, of a plating bath arrangement provided in accordance with practice of this invention. The copper electroplating solution 36 is contained in a rectangular tank 38 having generally parallel side walls 40 and end walls 42. (Only one such end wall is shown). A plurality of banks of anodes 44 are in the tank spaced apart from each other along the length of the tank. Anodes of any suitable material may be used. Preferred anodes comprise titanium anode baskets containing chunks or slugs of copper metal in the form of pellets, buttons, balls, or the like. The anodes 44 are typically contained in filtering bags (not shown) to prevent contamination of the electroplating solution by particulate matter which results during anode dissolution.

Spaced apart from each bank of anodes 44 is a conductive metal grating or screen 46. Each such metal screen extends across the plating tank between its side walls 40 and generally parallel to its end walls 42. The screens can be held in place for example, by tracks or grooves 47 (shown in FIG. 6) mounted in the tanks. As used herein, the phrase "across the plating tank" means that the screen extends substantially across the entire cross-sectional area of the plating tank, for example, as shown in FIGS. 6 and 7.

The screens 46 comprise a wire cloth, preferably having a mesh size of from about 60 to about 325. The number appearing before "mesh" or "mesh size" is the number of wires per square inch in the wire cloth. The presently preferred screen 46 comprises 220-mesh wire cloth. The screen may be made of any conductive material, stainless steel being preferred.

The printed circuit board substrate 32 (at the stage shown in FIG. 5) is immersed in the electroplating solution 36 in an orientation generally parallel to the end walls 42 of the plating tank 38 about equidistant between two banks of anodes 44 and also between two screens 46. The board is held in place, for example, by a thumb screw 45 in a conductive support 51 shown in FIG. 7. If desired, other conductive supports such as clips or the like could be used instead of the thumb screw 45 and support 51. In this arrangement, the screens 46 are interposed between each bank of anodes 44 and the printed circuit board substrate 32 with the plane of the substrate about parallel to the plane of the associated screens. In a particularly preferred embodiment of this invention, the printed circuit board substrate is about 14 inches from each bank of anodes 44 and about 7 inches from each screen 46.

As can be seen in FIG. 7, the anodes 44 are electrically connected, e.g., by insulated wire 48, to the positive terminal 49 of a rectifier 50, or other direct current voltage source. The copper layers 23 (not shown in FIGS. 6 or 7) of the printed circuit board substrate 32 are electrically connected to the conductive support 51, e.g., by insulated wire 52, to the negative terminal 53 of the rectifier 50. In this arrangement, activation and adjustment of the rectifier establishes a first potential difference between the anodes 44 and the printed circuit board substrate 32 which results in the dissolution of copper from the anodes 44, passage of copper ions from the anodes to the printed circuit board substrate 32 and the deposition of copper onto the uncovered portion of the layer 23 of the circuit board substrate. In a typical example this first potential difference is from about 0.75 volts to about 1.5 volts.

The screens 46 are also electrically connected, e.g., by insulated wire 54 to the negative terminal 53 of the rectifier. In this arrangement, a potential difference is established between the anodes 44 and the screens 46 when the rectifier is activated. This results in the deposition of copper onto the screen. However, a variable resistor 56 is interposed in the electrical connection between the screens 46 and the rectifier 50. The purpose of the resistor 56 is to reduce the potential difference between the anodes 44 and the screens 46 to less than the potential difference between the anodes 44 and the printed circuit board substrate 32.

The resistor 56 is set to have a resistance which assures that the potential difference between the anodes 44 and the screens 46 is sufficiently less than the potential difference between the anodes and the printed circuit board substrate 32 to provide electrodeposition of copper on the printed circuit board substrate when the rectifier 50 is activated. However, the resistor 56 is also set to provide a potential difference between the anodes 44 and the screens 46 which is sufficient to reduce and preferably minimize the difference between the current density at the periphery of the printed circuit board substrate 32 and the current density at the center.

It is preferred that the resistor 56 be set so that the potential difiference between the anodes 44 and the screens 46 is from about ($\frac{1}{8}$) to about ($\frac{1}{2}$) of the potential difference between the anodes 44 and the printed circuit board substrate 32, and more preferably about $\frac{1}{4}$ of the potential difference between the anodes and the printed circuit board substrate. A first potential difference of about 1.0 volt between the anodes and the printed circuit board substrates and a second potential difference of a about 0.25 volt between the anodes and the screens presently preferred.

In some situations, the area to be plated on one side of the printed circuit board substrate 32 differs from that on the other side. In such situation, the circuitry lines on one side of the printed circuit substrate 32 will deposit to a different thickness from that on the other side. Accordingly, to compensate for the difference in plating area and thereby assure the same plating thickness on each side of the printed circuit board substrate, it may be desirable to independently adjust the potential difference between each screen 46 and the anodes 44.

Figure 8:
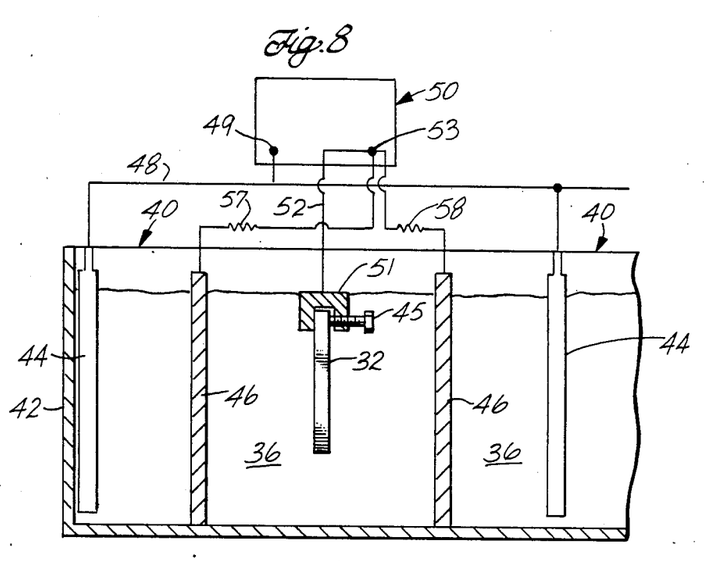
FIG. 8 is a semi-schematic, fragmentary, cross-sectional view of another preferred electroplating arrangement.

Thus, in a particularly preferred embodiment of the invention shown in FIG. 8, the single varible resistor 56 (shown in FIG. 7) is replaced by a pair of variable resistors 57 and 58 which are interposed in separate electrical connections between each of the screens 46 and the rectifier 50. The resistance of each variable resistor 57 and 58 can be adjusted independently to thereby adjust the potential difference between each screen 46 and the anodes 44.

Again, it is preferred that each of the resistors 57 and 58 be set so that the first potential difference, i.e., the potential difference between the anodes 44 and the screens 46 is from about ($\frac{1}{8}$) to about ($\frac{1}{2}$) of the second potential difference, i.e., the potential difference between the anodes 44 and the printed circuit board substrate 32. Adjustment of one or both resistors 57 and 58 can be made to assure even plating on both sides of the substrate 32. The precise adjustments required for a specific printed circuit board 32 can be calculated based on the difference in plating area on one side of the printed circuit board substrate 32 versus the other side or can be developed empirically.

It is to be understood that any means for establishing the first and second potential differences may be employed in the practice of this invention. For example, rather than utilizing one or more variable resistors in the electrical connections between the rectifier 50 and the screens 46, a second recitifier may be used. The second rectifier to which the anodes and screens are connected is simply adjusted to a desired voltage lower than that established by the first rectifier. In such an embodiment, variable resistors may still be employed in the electrical connections between the second rectifier and each of the screens 46 to independently control the potential difference between each separate screen 46 and the anodes.

Once the printed circuit board substrate 32 has been immersed in the electroplating solution, the rectifier 50 has been activated and the variable resistor or resistors set to establish the desired voltages, copper metal deposits on the printed circuit board substrate 32 over the portions of the copper layer 23 that are exposed and also in the holes 16 forming a conductive layer 18b (shown in FIG. 1) on top of the layer 18a creating a single conductive layer. Copper also deposits onto the metal screen 46. Surprisingly, however, because of the metal screen 46, copper deposits generally uniformly over the entire printed circuit board substrate 32. That is, the copper deeposits at about the same rate at the outer periphery of the printed circuit board substrate as it does the board's center.

Deposition of copper continues until the desired thickness is achieved. Thicknesses of the copper deposit greater than the thickness of the photosensitive layer 30 is not preferred because of the tendency of the copper desposits to grow laterally over the top of the photosensitive layer as well as over the existing copper deposits. Ultimately this could result in bridging between adjacent lines.

Once the electroplating has been completed, the plated printed circuit board substrate is removed from the electroplating solution and rinsed. After a predetermined number of plating cycles the screens are removed and the copper, which has plated out onto the screens, is stripped, for example, in a nitric acid strip, which dissolves the copper but does not attack the stainless steel screens.

A coating (not shown) is then applied to the surfaces of the printed circuit board substrate. The coating covers and protects the deposited copper circuit during a subsequent etch step. A preferred coating is a tin-lead coating which is applied by conventional electroplating techniques. The thickness of the coating is not critical but is sufficient to prevent significant etching of the underlying copper circuit lines in the subsequent etching step.

Before etching, however, the remainder of the photosensitive layer 30 (best seen in FIG. 5), which was cured by exposure to ultraviolet light and which covers the portions of the underlying copper layer 23 not electroplated, is stripped away by immersion in a solvent for the cured photosensitive material. This exposes the unwanted underlying copper which is then removed by immersion of the printed circuit board in an alkaline etch solution which dissolves the copper. The copper circuitry lines are protected from the etch solution by the tin-lead coating which is not attacked by the etch. Laterial undercutting of the electroplated copper lines occurs to some extent, however the unwanted copper foil is removed and the etching step is terminated before significant undercutting occurs.

Once the unwanted copper foil layer 23 has been removed by the etch, the remaining copper metal is in the pattern of the desired circuitry lines. The tin-lead coating is then etched from the copper circuit lines and a protective coating 20, e.g., a material supplied by Dupont Company under the trademark "VACREL", is applied over the circuit. This is done, for example, by applying the "VACREL" material over each face of the printed circuit board. A template is then placed over the "VACREL" material, the template covering holes or other spots on the printed circuit board which are to be soldered. The "VACREL" materials is then exposed with ultraviolet light which cures the "VACREL" material and bonds it to the printed circuit board substrate. The template is then removed and the portions of the "VACREL" material covered by the template are removed by immersion in a developer or solvent solution.

The board is then dipped into a solder bath and then rinsed of excess solder. A conductive solder layer 18c (best seen in FIG. 1) remains in the holes from which the "VACREL" material has been removed. The layers 18a, 18b and 18c form a conductive bridge between the two sides of the circuit board.

The present invention offers techniques for controlling the widths of electroplated circuitry lines by controlling the variation in current density over the surface of the printed circuit board. By utilizing the methods of the present invention, copper circuitry lines having a width of 5 mils or less and a spacing between adjacent lines of 5 mils or less can be achieved with high efficiency. Copper circuitry lines having a width of less than 2 mils and even less than 1 mil with a spacing between adjacent lines of less than two mils and even less than one mil can also be provided. Thus, practice of principles of this invention can result in a decrease in the overall size of some circuit boards of several magnitudes resulting in a significant savings in manufacturing costs. Conversely, a circuit board produced using the techniques provided in accordance with this invention can have substantially more circuit lines and hence can be provided with more electronic components than a circuit board of the same surface area produced by prior art techniques.

The present invention has been presented with reference to the preferred embodiment of the invention shown in the accompanying drawings. Workers skilled in the art and technology to which this invention pertains will appreciate that alterations and changes in the described process can be practiced without meaningfully departing from the principles, spirit and scope of this invention.

For example, it is apparent that any suitable electroless plating process may be used. The conductive layer 23, the electrolessly plated metal and the electroplated metal are all preferably copper because copper has high conductivity and is readily attacked by various chemicals which facilitate the etching process. However, other metals may be used as desired.

Any suitable coating for protecting the electroplated circuitry lines from the etch solution may be used. Likewise any suitable etch solutions may be employed.

Accordingly, the foregoing description should not be read as pertaining only to the precise process described but rather should be read consistent with and as support for the following claims which are to have their fullest fair scope.

EXAMPLE 1

Copper circuitry was electroplated onto a first printed circuit board substrate in a copper electroplating bath having the following composition:
Copper 3.6–4.3 oz./gal.
Copper Sulfate 14–17 oz./gal.
Sulfuric Acid 2.7–3.0 oz./gal.
Chloride 14–75 ppm.

The printed circuit board was 18 inches long by 12 inches wide and was spaced apart from the anodes about 14 inches. No screen was used. The voltage of the bath was one volt. The electrodeposition of copper lasted 60 minutes.

After electroplating, the first printed circuit board was cross-sectioned. A hole near the outer periphery of the board had a copper coating 0.00198 inches thick. A hole near the center of the board had a copper coating 0.00144 inches thick. This is a variation of 27%.

EXAMPLE 2

The procedure of Example 1 was followed with a second printed circuit board with the exception that screens made of a 220 mesh stainless steel wire cloth were interposed across the electroplating tank between the adjacent banks of anodes and the printed circuit board substrate. A one volt potential difference between the anodes and the printed circuit board substrate was established and a 0.25 volt potential difference between the anodes and the screens was also established. The electrodeposition lasted 75 minutes.

After electroplating, the second printed circuit board was cross-sectioned. The thickness of the copper coating was measured for a hole on the outer periphery and for a hole at the center. The location of the outer periphery hole was the same as the location of the outer periphery hole of Example 1 and the location of the center hole was the same as the location of the center hole for Example 1. The thickness of the copper deposit in both the outer periphery and center holes was 0.0018 mils.

What is claimed is:

1. A method for uniformly electroplating a conductive substrate comprising:
    providing a tank containing an electroplating solution;
    immersing at least one anode in the electroplating solution;
    immersing a conductive substrate in the electroplating solution at a location spaced apart from the anode;
    immersing an electrically conductive screen in the electroplating solution, the screen extending across the electroplating tank between the anode and the substrate; and
    by means of a direct current source, simultaneously establishing a first potential difference between the anode and the substrate for electrolytically depositing metal onto the substrate and a second potential difference between the anode and the screen, wherein the second potential difference is less than the first potential difference and the screen voltage is less positive than the anode voltage to thereby minimize the difference between the current density at the center of the substrate and at the periphery of the substrate.

2. A method as claimed in claim 1 wherein the electroplating solution is a copper electroplating solution.

3. A method as claimed in claim 1 wherein the second potential difference is from about ($\frac{1}{8}$) to about ($\frac{1}{2}$) of the first potential difference.

4. A method as claimed in claim 3 wherein the second potential difference is about $\frac{1}{4}$ of the first potential difference.

5. A method as claimed in claim 4 wherein the first potential difference is about one volt, and the second potential difference is about 0.25 volt.

6. A method as claimed in claim 1 wherein the screen has a mesh size of from about 60 to about 325.

7. A method as claimed in claim 6 wherein the screen has a mesh size of about 220.

8. A method as claimed in claim 1 wherein the substrate is spaced apart about 14 inches from the anode.

9. A method as claimed in claim 8 wherein the screen is spaced apart about 7 inches from the anode.

10. A method as claimed in claim 1 wherein the face of the substrate being plated is substantially parallel to the plane of the screen.

11. A method for uniformly electroplating a conductive substrate comprising:
    providing an electroplating tank containing a copper electroplating solution;
    immersing at least one anode in the copper electroplating solution;
    immersing a conductive substrate in the copper electroplating solution at a location spaced apart about 14 inches from the anode;
    immersing a conductive screen in the copper electroplating solution, the screen extending across the electroplating tank between the anode and the substrate, wherein the plane of the screen is substantially parallel to the face of the substrate being plated; and
    by means of a direct current source establishing for a selected period of time a first potential difference between the anode and the substrate and a second potential difference of about ($\frac{1}{8}$) to about ($\frac{1}{2}$) the first potential difference between the anode and the screen, wherein the screen voltage is less positive than the anode voltage.

12. A method as claimed in claim 11 wherein the screen is spaced apart about 7 inches from the anode.

13. A method as claimed in claim 11 wherein the second potential difference is about $\frac{1}{4}$ of the first potential difference.

14. A method as claimed in claim 13 wherein the first potential difference is about one volt, and the second potential difference is about 0.25 volt.

15. A method as claimed in claim 11 wherein the screen has a mesh size of about 220.

16. A method for electroplating copper circuitry onto a printed circuit board substrate comprising:

providing a printed circuit board substrate comprising a nonconductive base, a first conductive layer over at least one side of the base, and a second nonconductive layer over the first conductive layer covering only those portions of the first conductive layer where the copper circuitry is not desired;

providing an electroplating tank containing a copper electroplating solution, at least one anode immersed in the copper electroplating solution, and a conductive screen immersed in the copper electroplating solution which extends across the electroplating tank at a position spaced apart from the anode;

immersing the printed circuit board substrate in the copper electroplating solution at a location spaced apart from the anode, the screen extending across the bath between the anode and the substrate with the plane of the screen being substantially parallel to the plane of the substrate; and by means of a direct current source establishing a first potential difference between the anode and the substrate and a second potential difference between the anode and the screen for a time sufficient to deposit copper on the substrate to a selected depth, the second potential difference being less than the first potential difference and the screen voltage being less positive than the anode voltage.

17. A method as claimed in claim 16 wherein the first potential difference is about 1 volt and the second potential difference is about 0.25 volt.

18. A printed circuit board comprising a plurality of electroconductive copper lines wherein portions of a plurality of such lines are parallel to portions of adjacent lines and wherein at least some of the adjacent parallel line portions are spaced apart from each other less than about 5 mils, the circuit board formed by a process comprising the steps of:

providing a printed circuit board substrate comprising a nonconductive base, an electrically conductive layer over at least one side of the base, and a nonconductive layer over portions of the conductive layer, the nonconductive layer forming the pattern for the circuit to be formed on the board by covering such portions of the conductive layer where copper lines are not desired and by leaving uncovered those portions of the conductive layer where copper lines are desired, the pattern including a plurality of lines to be formed wherein portions of a plurality of such lines are parallel to portions of adjacent lines where the width of the nonconductive layer between at least some of the adjacent parallel portions is no more than about 5 mils;

providing an electroplating tank containing a copper electroplating solution, at least one anode immersed in the copper electroplating solution, and a conductive screen immersed in the copper electroplating solution extending across the electroplating tank at a position spaced apart from the anode;

immersing the printed circuit board substrate in the copper electroplating solution at a location spaced apart from the anode, so that the screen extends across the bath between the anode and the substrate; and by means of a direct current source establishing a first potential difference between the anode and the substrate and a second potential difference between the anode and the screen for a sufficient time to deposit copper on those portions of the substrate left uncovered by the nonconductive layer, the second potential difference being less than the first potential difference and the screen voltage being less positive than the anode voltage.

19. A printed circuit board as claimed in claim 18 wherein the first potential difference is about 1 volt and the second potential difference is about 0.25 volt.

20. A printed circuit board comprising a plurality of electroconductive copper lines wherein portions of a plurality of such lines are parallel to portions of adjacent lines and wherein at least some of the adjacent parallel line portions are spaced apart from each other less than about 2 mils, the circuit board formed by a process comprising the steps of:

providing a printed circuit board substrate comprising a nonconductive base, a conductive layer over at least one side of the base, and a nonconductive layer over the conductive layer, the nonconductive layer forming the pattern for the circuit to be formed on the board by covering the portions of the conductive layer where copper lines are desired, the pattern including a plurality of lines to be formed wherein portions of a plurality of such lines are parallel to portions of adjacent lines where the width of the nonconductive layer between at least some of the adjacent parallel portions is no more than about 2 mils;

providing an electroplating tank containing a copper electroplating solution, at least one anode immersed in the copper electroplating solution, and a conductive screen immersed in the copper electroplating solution extending across the electroplating tank at a position spaced apart from the anode;

immersing the printed circuit board substrate in the copper electroplating solution at a location spaced apart from the anode, so than the screen extends across the bath between the anode and the substrate; and by means of a direct current source establishing a first potential difference between the anode and the substrate and a second potential difference, less than the first potential difference, between the anode and the screen for a sufficient time to deposit copper on those portions of the substrate left uncovered by the nonconductive layer, the screen voltage being less positive than the anode voltage.

21. A printed circuit board as claimed in claim 20 wherein the first potential difference is about 1 volt and the second potential difference is about 0.25 volt.

22. An electroplating assembly for plating a substrate comprising:

a tank for containing an electroplating solution;

at least one anode to be immersed in the electroplating solution when such a solution is in the tank;

means for holding a substrate to be plated in the tank;

means for holding an electrically conductive screen in the tank at a location between such an anode when the anode is in place in the tank and a substrate holding location; and direct current means for establishing a first potential difference between such an anode and such a substrate when the substrate is in place in the tank for electrolytically depositing metal onto the substrate and for establishing a second potential difference between the anode and such an electrically conductive screen when the screen is in place in the tank for minimizing the difference between the current density at the center of the substrate and at the periphery of the substrate, the second potential difference being less than the first potential difference and the screen voltage being less positive than the anode voltage.

23. An electroplating assembly as claimed in claim 22 wherein the screen is stainless steel.

24. An electroplating assembly as claimed in claim 22 wherein the substrate holding means is designed to provide the face of the substrate substantially parallel to the plane of the screen.

25. A method for uniformly electroplating a generally flat conductive substrate comprising:

providing a tank containing an electroplating solution;

immersing a pair of anodes in the electroplating solution at locations spaced apart from each other;

immersing the substrate in the electroplating solution at a location between the anodes;

immersing a pair of electrically conductive screens in the electroplating solution each of which extends across the electroplating tank at a location between the substrate and the adjacent anode; and by means of a direct current source simultaneously establishing a first potential difference between the anodes and the substrate for electrolytically depositing metal onto the substrate and a second potential difference of from about ($\frac{1}{8}$) to about ($\frac{1}{2}$) the first potential difference between the anodes and the screens for minimizing the difference between the current density at the center of the substrate and at the periphery of the substrate, the screen voltage being less positive than the anode voltage.

26. A method as claimed in claim 25 further comprising separately adjusting the potential difference between the anodes and each screen to minimize the difference in thickness of the metal depositing on one side of the substrate as compared to the other side of the substrate.

* * * * *